United States Patent
Armbruster et al.

(10) Patent No.: US 8,212,559 B2
(45) Date of Patent: Jul. 3, 2012

(54) NMR-MAS PROBEHEAD WITH INTEGRAL TRANSPORT CONDUIT FOR AN MAS-ROTOR

(75) Inventors: Martin Armbruster, Achern (DE); Benno Knott, Karlsruhe (DE)

(73) Assignee: Bruker BioSpin GmbH, Rheinstetten (DE)

( * ) Notice: Subject to any disclaimer, the term of this patent is extended or adjusted under 35 U.S.C. 154(b) by 339 days.

(21) Appl. No.: 12/588,314

(22) Filed: Oct. 13, 2009

(65) Prior Publication Data
US 2010/0109666 A1 May 6, 2010

(30) Foreign Application Priority Data
Oct. 31, 2008 (DE) .......... 10 2008 054 152

(51) Int. Cl.
*G01V 3/00* (2006.01)
(52) U.S. Cl. .................. 324/307; 324/321
(58) Field of Classification Search .......... 324/300–322; 600/407–445
See application file for complete search history.

(56) References Cited

U.S. PATENT DOCUMENTS

| | | | |
|---|---|---|---|
| 4,511,841 A | 4/1985 | Bartuska | |
| 4,859,948 A * | 8/1989 | Kuster | 324/318 |
| 5,150,054 A | 9/1992 | Dupree | |
| 7,081,753 B2 * | 7/2006 | Mullen et al. | 324/318 |
| 7,170,292 B2 * | 1/2007 | Doty et al. | 324/321 |
| 7,282,919 B2 * | 10/2007 | Doty et al. | 324/321 |
| 7,436,181 B2 * | 10/2008 | Krahn et al. | 324/321 |
| 7,518,371 B2 * | 4/2009 | Spraul et al. | 324/321 |
| 7,535,224 B2 * | 5/2009 | Hu et al. | 324/307 |
| 7,915,893 B2 * | 3/2011 | Shevgoor et al. | 324/318 |
| 2005/0280415 A1 | 12/2005 | Hofmann | |
| 2006/0082371 A1 | 4/2006 | Doty | |
| 2006/0176056 A1 | 8/2006 | Doty | |
| 2008/0088312 A1 | 4/2008 | Spraul | |

FOREIGN PATENT DOCUMENTS
EP 0 502 444 9/1992

OTHER PUBLICATIONS

Sid Shevgoor et al., "Development of a CryoMAS™ HR-MAS-MAG NMR Probe for High-field WB Magnets", Doty Scientific, Columbia, SC, USA, ENC 2005, Providence, Rhode Island, USA, www.dotynmr.com/PDF/CryoMAS_ENCOS.pdf.

* cited by examiner

Primary Examiner — Brij Shrivastav
(74) Attorney, Agent, or Firm — Paul Vincent

(57) ABSTRACT

A nuclear magnetic resonance (NMR) magic angle spinning (MAS) probe head (1; 61) for measuring a measuring substance in an MAS rotor (21a-21c), comprises a bottom box (3) and a tube (2) mounted to the bottom box (3) and projecting from the bottom box, wherein, in the area of the end (5) of the tube (2) facing away from the bottom box (3), an MAS stator (7; 62) is disposed within the tube (2) for receiving an MAS rotor (21a-21c), and with a pneumatic sample changing system for supplying and discharging an MAS rotor (21a-21c) to/from the MAS stator (7; 62). A transport conduit (10) is provided for pneumatically transferring an MAS rotor (21a-21c) within the transport conduit (10), wherein the transport conduit (10) extends in the inside of the tube (2) from the bottom box (3) to the MAS stator (7; 62). The probe head realizes fast change between different MAS rotors and facilitates RF shielding and keeping of defined extreme temperature conditions.

15 Claims, 6 Drawing Sheets

NMR-MAS PROBEHEAD WITH INTEGRAL TRANSPORT CONDUIT FOR AN MAS-ROTOR

This application claims Paris Convention priority of DE 10 2008 054 152.4 filed Oct. 31, 2008 the complete disclosure of which is hereby incorporated by reference.

BACKGROUND OF THE INVENTION

The invention concerns a nuclear magnetic resonance (NMR) magic angle spinning (MAS) probe head for measuring a measuring substance in an MAS rotor, with a bottom box and a tube that is mounted to the bottom box and projects therefrom, wherein an MAS stator is disposed within the tube in the area of the end of the tube facing away from the bottom box for receiving an MAS rotor, and with a pneumatic sample changing system for supplying and removing an MAS rotor to/from the MAS stator.

An NMR-MAS probe head of this type is disclosed e.g. in the technical poster "Development of a CryoMAS™ HR-MAS-MAG NMR Probe for High-field WB Magnets", Sid Shevgoor et al., Doty Scientific, Columbia, S.C., USA presented at ENC 2005, Providence, R.I., USA, accessible on the internet on Oct. 9, 2008 at www.dotynmr.com/PDF/CryoMAS_ENC05.pdf.

Nuclear magnetic resonance (NMR) spectroscopy is a method of instrumental analysis for determining, in particular, the chemical composition of measuring samples. Radio frequency (RF) pulses are thereby irradiated into the measuring sample that is located in a strong static magnetic field, and the electromagnetic response of the sample is measured.

An NMR sample is conventionally rotated while tilted at the so-called "magic angle" of approximately 54.74° with respect to the static magnetic field ("MAS"=Magic Angle Spinning) during spectroscopic measurement in order to reduce line broadenings due to anisotropic interactions. Towards this end, the sample is filled into an MAS rotor. MAS rotors are small cylindrical tubes that are open on one side and are closed by a cap, wherein the cap has wing elements ("small fan wheels"). The MAS rotor is disposed in an MAS stator and the MAS rotor is rotationally driven by gas pressure via the wing elements. The MAS rotor and the MAS stator as a whole are called an MAS turbine.

During the NMR measurement, the MAS turbine is disposed in an NMR-MAS probe head. The probe head has a cylindrical shielding tube (also briefly called "tube") and a bottom box. Radio frequency (RF) electronic components, in particular RF resonator coils, and the MAS turbine are housed in the tube, wherein the MAS turbine is disposed in the area of the end of the tube facing away from the bottom box. The shielding tube of the probe head is typically introduced from below into the vertical room temperature bore of a superconducting magnet, is positioned and held by hooks, supports, screws or the like. The MAS turbine is then located exactly in the magnetic center of the magnet.

With simple probe heads, the probe head must be removed from the magnet, i.e. the probe head must be removed from the room temperature bore, for changing an NMR probe or an MAS rotor filled with measuring substance. Towards this end, the user kneels below the magnet, releases the holders and cable connections and receives the probe head when it slides out of the magnet. Removal of the probe head or also reinsertion of the probe head into the magnet may require a considerable amount of force due to eddy currents induced in the metal parts of the probe head, in particular in the shielding tube, and the net weight of the probe head. The manufacturers of probe heads stipulate in their instructions that a probe head be removed by two persons together for reasons of safety. The rotor can then be manually changed on the removed probe head. A rotor change, i.a. new positioning of the probe head in the magnet, requires in most cases renewed shimming such that this overall procedure is very complex.

According to document DE 38 18 039 A1, a rotatable sample magazine is provided in the direct vicinity of the MAS stator on the probe head such that the sample in the MAS stator can be changed several times through application of gas pressure without removing the probe head or the probe magazine from the inside of the magnet.

The technical poster of Shevgoor et al. discloses the use of a lifting system for MAS rotors. A transport conduit is connected to the end of the tube of a probe head facing away from the bottom box. The transport conduit extends through the room temperature bore of a magnet in an upward direction and out of the magnet. An MAS rotor can be supplied by gas pressure through the transport conduit into the MAS stator of the probe head mounted in the magnet, and an MAS rotor can also be removed from the MAS stator in an upward direction out of the probe head.

Due to the fact that the transport conduit is guided through the room temperature bore, the room temperature bore is obstructed, in particular, also above the magnet, thereby increasing the instrumental expense. The transport conduit also aggravates initial mounting of the probe head. The transport conduit must also be guided through the wall of the shielding tube to the MAS stator, thereby aggravating RF shielding of the sample during the NMR measurement.

Moreover, many cases require measurement of the sample under defined extreme temperature conditions, in particular at cryogenic temperatures (−196° C. or less). The inside of the shielding tube is thereby temperature-controlled or cooled. In this case, passage of the transport conduit through the tube at the end remote from the bottom box represents a heat conducting bridge that aggravates keeping of the defined extreme temperature conditions.

It is the underlying purpose of the invention to provide an NMR-MAS probe head which enables fast change between different MAS rotors, and facilitates RF shielding and keeping of defined extreme temperature conditions.

SUMMARY OF THE INVENTION

This object is achieved by an NMR-MAS probe head of the above-mentioned type which is characterized in that a transport conduit is provided for pneumatic transfer of an MAS rotor within the transport conduit, wherein this transport conduit extends in the inside of the tube from the bottom box to the MAS stator.

The tube may be closed in the area around the MAS turbine, i.e. in the area of the free end of the tube (facing away from the foot) since the transport conduit extends inside the tube (shielding tube). A duct through the wall of the tube for the transport conduit is not necessary.

The shielding effect of the normally metallically conducting but non-ferromagnetic tube can thereby be completely maintained. Nor is it necessary to tolerate any heat conducting bridge due to passage of a transport conduit through the tube in the area of the end remote from the bottom box.

Only the tube of the probe head projects through the room temperature bore. The side of the room temperature bore of the NMR magnet opposite the probe head does not require a superstructure, which facilitates the construction of an NMR apparatus, in particular of an NMR spectrometer. The overall sample change (rotor change) can be performed only from one side of the NMR magnet, i.e. from the side of the NMR probe head (which is typically the lower side of the NMR magnet) via a pneumatic lifting system. The sample change can thereby be automated. A semi-automatic sample change (with manual change trigger, but automatic change execution after change trigger) is preferably provided.

In one particularly preferred embodiment of the inventive probe head, the transport conduit contains a deflector means with a blind hole section for intermediate storage of an MAS rotor, wherein the blind hole section is disposed beyond the MAS stator as viewed from the bottom box. The main functions of the deflector means (turning means) consist in
- eliminating tight bends in the transport conduit for loading and unloading the MAS rotor, and
- enabling favorable orientations of the MAS rotors, in particular with upwardly facing sealing caps during transport and positioning on the closed bottom end (remote from the cap) of the sample tube of the rotor in the MAS stator. The elimination of tight bends considerably reduces the space required for the transport conduit. The deflector means realizes, in a simple fashion, an approximately 180° reversal of the transport direction of the MAS rotor after intermediate storage in the blind hole section without having to pass through a 180° curve. During turning, the orientation (i.e. the sequence cap-to-bottom end) of the rotor changes with respect to the transport direction. The turning means permits, in particular, introduction of the rotor, with its bottom end first, into the stator, wherein the insertion opening of the stator faces away from the bottom box side end of the sample tube. The transport conduit thereby extends from the bottom box past the stator and to the blind hole section. Both a conduit section (typically having no or only a slight transport conduit curvature) leading to the MAS stator (or also directly the MAS stator) and also the conduit section extending past the stator to the bottom box are accessible from the blind hole section. The blind hole section may also provide a resilient buffer volume, if necessary, in order to prevent hard impact of the rotor at the bottom of the blind hole section and facilitate immediate removal of the rotor from the blind hole section.

In an advantageous further development of this embodiment, the blind hole section is disposed to be rotatable. This reduces or completely eliminates bends in the transport conduit and, in particular, in a conduit section that leads to the MAS stator. The rotation of the blind hole section may be controlled by gas pressure. There are typically two stop positions of the rotatable blind hole section, in each of which the MAS stator and the conduit section leading to the bottom box can be accessed.

In an alternative further development, the deflector means contains a branching point of the transport conduit. The deflector means is thereby realized in a particularly simple fashion. It should be noted that the transport conduit has a larger cross-section in the branching area (compared to the outer dimensions of the MAS rotor or the remaining transport conduit).

In an advantageous further development thereof, one or more nozzles are provided in the area of the branching point for pneumatic deflection of an MAS rotor. This particularly facilitates control of the transport direction of the rotor. In an alternative fashion, the rotor can be directed only by means of transport gas flows at the branching point within the transport conduit.

In a preferred further development of the above-mentioned embodiment, the MAS stator has a bottom bearing, wherein the bottom bearing faces the bottom box. When the probe head is conventionally inserted from below (with the bottom box being disposed below) into a magnet, the bottom bearing of the stator is downwardly orientated such that the rotor is supported on the bottom bearing due to gravity and is thereby also held in the stator due to gravity during the measurement. A deflector means is particularly advantageous for this further development. This facilitates transport of the MAS rotor even when there is only little space in the tube. The rotor can then be inserted with its cap being orientated in an upward direction.

It is noted that the orientation of the (in the present case) bottom bearing relative to the bottom box is defined thereby taking into consideration the inclination of the magic angle. One of the two front face ends of the MAS stator bearing area is disposed closer to the bottom box (the end facing the bottom box) and the other one is disposed further away from the bottom box (the end facing away from the bottom box). The bottom bearing and a first radial bearing are formed at one end, and a second radial bearing and the insertion opening for the rotor are formed at the other end (the insertion opening is thereby typically formed in the second radial bearing). The magnetic center of the magnet is disposed between the two opposite radial bearings or ends (in the installed state of the probe head in the magnet). The end facing the bottom box is disposed closer to the bottom box than the magnetic center, and the end facing away from the bottom box is disposed further away from the bottom box than the magnetic center.

In another embodiment of the inventive probe head, the MAS stator has a bottom bearing, wherein the bottom bearing faces away from the bottom box. In this embodiment, the probe head is preferably inserted into the magnet from above such that the rotor can again be supported on the bottom bearing during the measurement under the force of gravity. In this embodiment, the transport conduit to the MAS stator can be formed without deflector means even when there is little space, since the rotor can be inserted into the stator via the front face of the MAS stator bearing close to the bottom box.

In another preferred embodiment, the electrical components of the probe head are mounted to the transport conduit. The transport conduit then has a double function. It also becomes part of the mechanical structure of the probe head in the area of the tube. The transport conduit is then typically at least partially formed as a rigid tube.

In one particularly preferred embodiment, the tube is completely closed in the area of the end facing away from the bottom box. This improves or facilitates electromagnetic shielding by the tube. The overall tube is typically completely closed up to the point where it is mounted to the bottom box.

In one particularly preferred further development of this embodiment, the probe head is formed as a Dewar vessel in the area of the tube, i.e. the tube has a double wall with a vacuum between the walls. This facilitates temperature-control or cooling of the measuring sample in the probe head for the NMR measurement. The closed design eliminates undesired heat conducting bridges.

In another preferred embodiment, the MAS stator is disposed to be rotatable. The rotatability of the stator in the probe head further facilitates insertion and removal of the MAS rotor when there is little space. Tight bends are eliminated. Due to the rotatability of the stator, the angle of the stator bearing axis with respect to the longitudinal extension of the tube (which usually corresponds, at least to good approximation, to the direction of the static magnetic field in the NMR magnet) can be reduced compared to the magic angle for introduction and removal.

The present invention also concerns an NMR apparatus comprising a superconducting magnet arrangement with a room temperature bore into which an inventive probe head is inserted. The NMR probe or the MAS rotor in the probe head containing the sample can be easily changed, in particular, without removing the probe head. The invention facilitates assembly of the NMR apparatus in comparison with prior art. The NMR apparatus is preferably designed as a complete NMR spectrometer.

In one preferred embodiment of the inventive NMR apparatus, the room temperature bore is orientated in a vertical direction. In this case, the accessibility to and the space requirements for the two ends of the room temperature bore are generally critical such that this case particularly benefits from the advantages of the invention.

In a particularly preferred further development, which utilizes a probe head with turning means and a bottom bearing of the MAS stator facing the bottom box, the probe head is inserted into the room temperature bore from below. The rotor can be inserted into the transport conduit (with the cap facing in an upward direction and cap first), can be blown in an upward direction to the blind hole section, and then be lowered from the top into the stator (still with the cap facing in an upward direction but with the bottom end of the rotor first) and vice versa. The transport conduit requires only little space.

Another preferred further development utilizes a probe head with a bottom bearing of the stator facing away from the bottom box, wherein the probe head is inserted into the room temperature bore from the top. The rotor can then be inserted into the transport conduit (with the cap facing in an upward direction and with the sample tube bottom first) and be lowered into the stator, wherein the cap remains orientated in an upward direction. The transport conduit requires, in turn, only little space.

Further advantages of the invention can be extracted from the description and the drawing. The features mentioned above and below may be used in accordance with the invention either individually or collectively in arbitrary combination. The embodiments shown and described are not to be understood as exhaustive enumeration but have exemplary character for describing the invention.

The invention is illustrated in the drawing and explained in more detail with reference to embodiments.

DESCRIPTION OF THE PREFERRED EMBODIMENT

The invention concerns a new system for changing MAS rotors in an MAS-NMR probe head, wherein the probe head remains mounted in the magnet of an NMR spectrometer.

Figure 1:
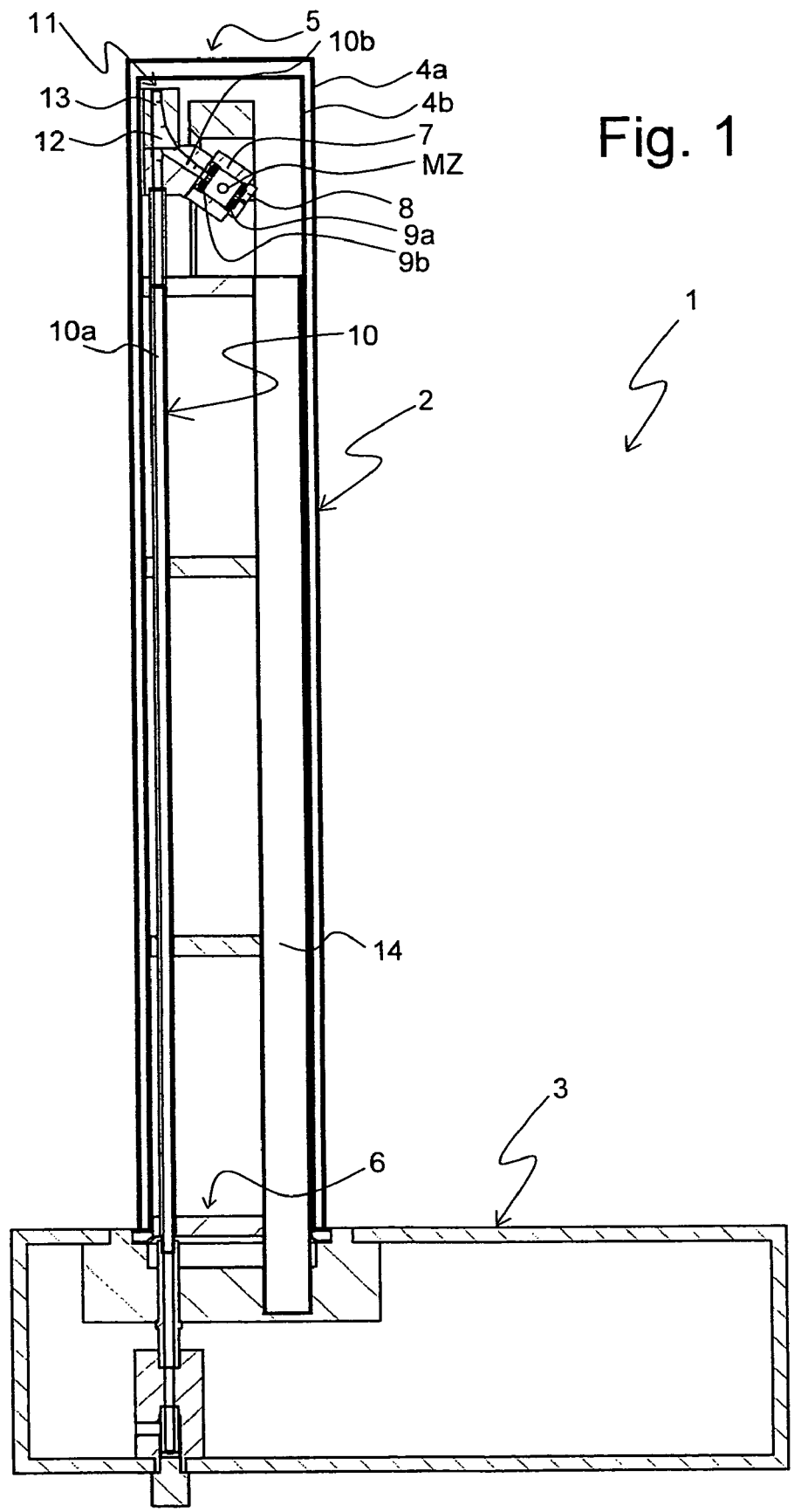
FIG. 1 shows a schematic cross-sectional view of an inventive NMR-MAS probe head comprising a deflector means with branching point.

FIG. 1 shows an inventive NMR-MAS probe head 1 in a vertical cross-sectional plane. The probe head 1 substantially comprises a tube 2 to be inserted into the room temperature bore of a magnet for an NMR measurement, and a bottom box 3. The tube 2 is mounted to the bottom box 3. The tube 2 projects past the bottom box 3 (in the present case) in a vertical direction. The bottom box 3 remains outside of the room temperature bore of the magnet. The overall probe head 1 is typically held or mounted, in particular, to the magnet or a substructure of the magnet, via the bottom box 3.

The tube 2 has a double wall (comprising an outer wall 4a and an inner wall 4b) with a vacuum in between such that the tube 2 is simultaneously formed as a Dewar vessel for thermal insulation from the surroundings (usually at room temperature). If required, temperature-control conduits may extend in the tube 2 (not shown in detail) in which (in the present case) a coolant circulates, such as liquid nitrogen, to cool the inside of the tube 2 including measuring sample in an MAS rotor and an NMR measuring electronics, in particular, RF resonators in the surrounding area of the MAS rotor. The transport gas flow in the transport conduit 10 and/or other functional gas flows (see below) may also be cooled alternatively or additionally, thereby also effectively cooling the inside of the tube 2 (when the tube 2 is well insulated).

At least one wall 4a, 4b of the tube 2 is produced from a non-ferromagnetic metal with good electrical conduction (e.g. copper). The metal tube wall shields the tube interior from external electromagnetic alternating fields. For this reason, the tube 2 is also called a shielding tube.

The free (in FIG. 1 upper) end 5 of the tube 2 facing away from the bottom box 3 is closed, in particular, any ducts for gas or transport conduits are omitted. Access to the tube interior, e.g. for electric, gas or transport conduits, is provided exclusively in the area of the end 6 of the tube 2 close to the bottom box.

In the area of its free end 5, the tube 2 contains an MAS stator 7. The stator 7 holds an MAS rotor (not shown in FIG. 1) at the magic angle (relative to the longitudinal extension of the tube 2 which is orientated parallel to the static magnetic field during the measuring operation) and supports it for rotation about the longitudinal axis of the rotor. At its front face, the stator 7 has a bottom bearing 8 on which the rotor can be supported in the stator 7 (and is thereby supported from below in response to gravity). Two nozzles (not shown in detail) for a bearing gas flow and an eject gas flow are formed in the bottom bearing 8. The stator 7 also has a first lower radial bearing 9a close to the bottom bearing 8 as well as a second opposite upper radial bearing 9b, each having one opening for passage of the rotor. The bottom bearing 8 and the first radial bearing 9a face the bottom box 3 and the second radial bearing 9b faces away from the bottom box 3. The magnetic center MZ of the magnet arrangement is located in the center between the first and the second radial bearing 9a, 9b in the NMR measurement. The stator 7 has gas nozzles (not shown in detail) for blowing gas onto the inserted rotor in order to rotate it.

Moreover, a transport conduit 10 for MAS rotors extends inside the tube 2. A first section 10a of the transport conduit 10 extends from the end 6 of the tube 2 close to the bottom box past the stator 7 to a deflector means 11. A second section 10b of the transport conduit 10 extends from the deflector means 11 to the stator 7. The deflector means 11 comprises a blind hole section 13 and a branching point 12 of the transport conduit 10 (see also FIG. 2 in this connection). The transport conduit 10 is generally formed by flexible hoses and/or rigid tubes and may also contain curved sections (curves) in addition to straight sections, thereby taking into consideration the size of the MAS rotors and the play of the rotors in the transport conduit 10. The rotors are pneumatically transported in the transport conduit 10 by means of gas pressure and/or gravity.

A robust frame 14 is moreover formed inside of the tube 2 on which the stator 7 and different electronic components (not separately shown) are disposed for an NMR measurement on a measuring sample disposed in the stator. In the present case, the first section 10a of the transport conduit 10 is formed as a rigid tube, thereby improving the stability of the frame 14. Some electronic components are thereby directly mounted to the section 10a (not shown separately)

Figure 2:
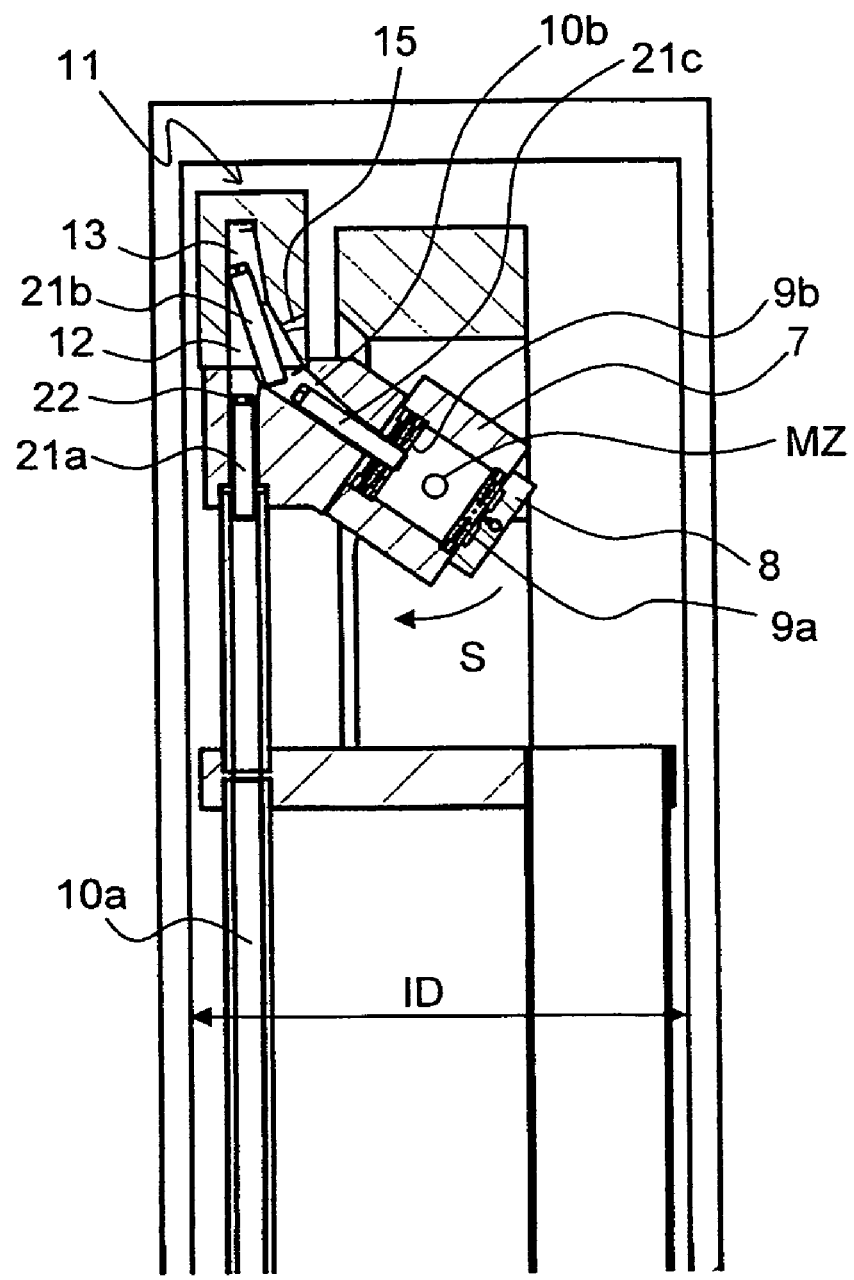
FIG. 2 shows an enlarged view of the free end of the tube of the probe head of FIG. 1.

FIG. 2 describes in detail insertion of an MAS rotor 21a, 21b, 21c into the MAS stator 7 of the probe head of FIG. 1. The illustrations 21a, 21b, 21c of the rotor concern different stages of insertion.

A rotor 21a is initially transported by a gas flow through the first section 10a of the transport conduit in an upward direction towards the deflector means 11. The cap 22 of the rotor 21a thereby faces in an upward direction. Wing elements (fan wheels) (not shown in FIG. 2) are formed on this cap 22.

The gas flow acting from below forces the rotor 21a in an upward direction into the blind hole section 13. The gas flow then flows from the section 10a through the branching point 12 into the second section 10b of the transport conduit and to the stator 7. This gas flow then draws the rotor 21b in the direction of the second section 10b, i.e. the rotor 21b is pivoted with its lower bottom end toward the right-hand side and is lowered again. The gas flow finally forces the rotor 21c in the direction of the MAS stator 7 to the right in a downward direction into the second section 10b and into the stator 7. The transport direction is reversed during this process (turning process).

For removing a rotor 21c from the stator 7, the gas flow is reversed. It initially forces the rotor 21c from the stator 7 through the second section 10b into the blind hole section 13. Consequently gas flows from the second section 10b of the transport conduit through the branching point 12 into the first section 10a of the transport conduit. It pulls the rotor 21b towards the first section 10a and finally into the first section 10a such that the rotor 21a is returned to the bottom box through the first section 10a of the transport conduit. The transport direction is thereby also reversed (turning process).

The deflector means 11 disposed beyond (behind) the MAS stator 7, as viewed from the bottom box, may replace a 180° curve in the transport conduit by means of this turning process, and at the same time establish access to the MAS stator 7 on the side facing away from the bottom box through the second radial bearing 9b (in FIG. 2 from the top). Without deflector means 11, the rotor would have to be guided along a large bend of at least 180°−54.7°=125.3° in order to be moved from the vertical first section 10a of the transport conduit to the stator 7 inclined at the magic angle, and back. Since the feasible radius of curvature of a transport conduit is delimited by the dimensions of the rotor, a large bend of this type would require a large amount of space in the tube of the probe head. By avoiding the large bend, the tube inner diameter ID may be smaller such that an inventive probe head can also be inserted into narrow room temperature bores of magnet arrangements. The embodiment of FIG. 2 merely shows a slight curve of 54.7° in the area of the second section 10b of the transport conduit. In accordance with the invention, the outer diameter of the tube can be easily limited to 40 or 73 mm for conventional room temperature bores.

It must be noted that the end of the rotor 21a, 21b, 21c on the cap side substantially remains orientated in an upward direction during the overall insertion and removal procedure and also during the NMR measurement to eliminate the danger of leakage or outflow of sample material due to an untight cap.

A nozzle 15 (or also a plurality of nozzles, in particular opposite nozzles) may be provided in the area of the branching point 12 in order to support deflection of a rotor 21b, and to pneumatically deflect the MAS rotor 21b such that the rotor 21b moves along the desired path at the branching point 12.

The MAS stator 7 may also be disposed to be pivotable in order to reduce the curvature of movement of the MAS rotor 21b, 21c during movement from the blind hole section 13 to the MAS stator 7 and vice versa. For movement, the MAS 7 would then be pivoted in a clockwise direction in accordance with the pivoting direction S (in the present case shown as example for a pivoting movement about the magnetic center MZ). In this case, the second section 10b of the transport conduit could be steeper. The probe head could then have an even more compact design. Stops are advantageously provided for the positions of the stator 7 for measuring the NMR probe at the magic angle and for moving the rotor. The pivoting motion can be realized by gas pressure.

Figure 3A:
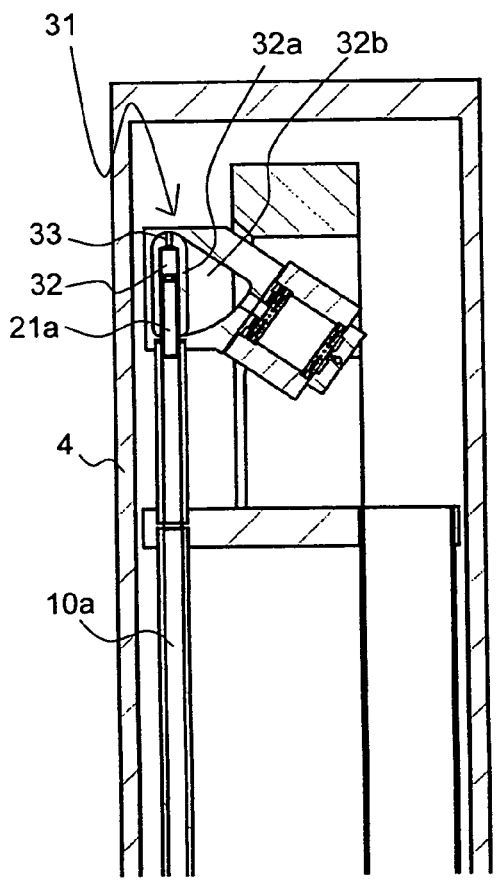
FIG. 3a shows a schematic view of an inventive probe head in the area of the free end of the tube with a deflector means comprising a rotatably disposed blind hole section (rocker) in a first position.

FIG. 3a shows an alternative embodiment of a deflector means 31 in an inventive NMR-MAS probe head. Only the differences with respect to the design of FIG. 2 are explained.

The deflector means 31 has a rotatably disposed blind hole section 32 that is formed in a rocker 32a. The rocker 32a can be pivoted about a point of rotation (in the present case the upper point of rotation) in a sector area 32b. An MAS rotor 21a can be inserted into the blind hole section 32. In the first position of the rocker 32a, shown in FIG. 3a, the blind hole section 32 can be accessed from the first section 10a of the transport conduit that extends to the bottom box. In particular, a rotor 21a can be introduced by a gas flow from below (through the first section 10a) into the rocker 32a or be discharged by a gas flow from the top (through the nozzle 33 at the end of the blind hole section 32) to the end of the transport conduit close to the bottom box.

Figure 3B:
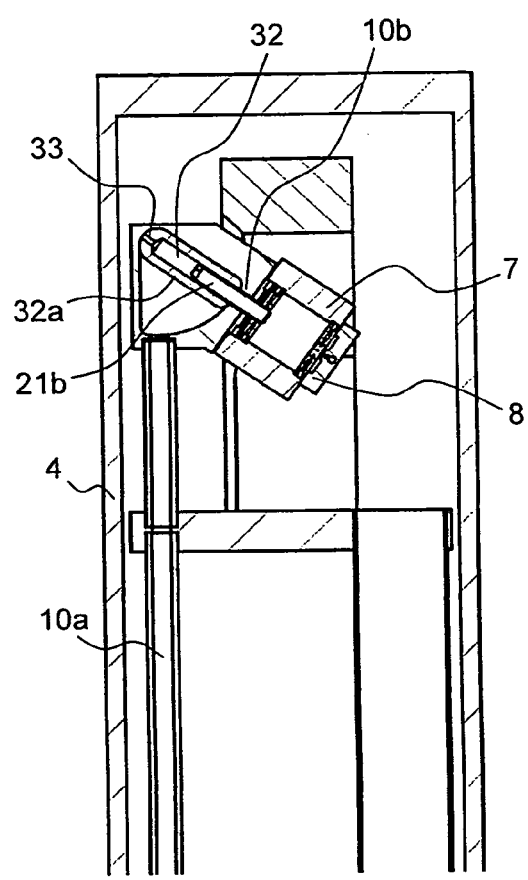
FIG. 3b shows the free end of the tube of FIG. 3a in a second position of the rotatably disposed blind hole section.

When an MAS rotor 21a is completely inserted into the rocker 32a, the rocker can be pivoted, in particular, to the second position shown in FIG. 3b. In this second position, the blind hole section 32 can be accessed by the second section 10b of the transport conduit or by the stator 7. When gas is blown through the nozzle 33 into the blind hole section 32, the rotor 21b is inserted into the stator 7. Vice versa, the rotor 21b can be supplied to the rotatable blind hole section 32 by blowing in gas from the bottom bearing 8. In this fashion, the deflector means 31 also enables a space-saving turning process.

The rocker 32a can be actuated (pivoted) by a pneumatic drive (not shown in detail), wherein each position shown in FIGS. 3a and 3b illustrates end positions on a mechanical stop (edges of the sector area 32b).

In the embodiment of the tube of the probe head of FIGS. 3a, 3b, the tube only has a single wall 4.

Figure 4:
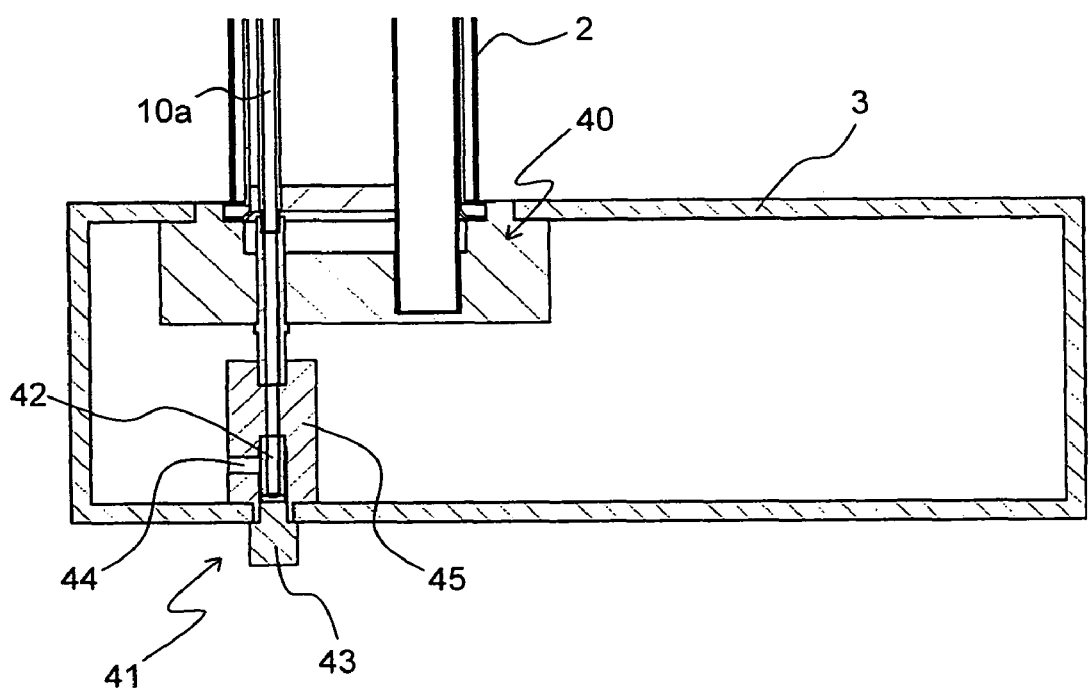
FIG. 4 is an enlarged view of the bottom box area of the probe head of FIG. 1.

FIG. 4 shows the bottom box 3 of the probe head of FIG. 1 in more detail. The bottom box 3 comprises a holder 40 for the tube 2 and electric connections, transport gas and functional gas connections (mostly bearing, drive, VT, insert, eject, rinsing and dry gas) (not shown in detail) and, if necessary, cooling means connections and, in the embodiment shown, also a rotor lock 41 that is formed as a cryo lock in the present case. The rotor lock 41 is located at an extension of the transport conduit (in the present case of its section 10a) and has a loading and unloading station 42.

The loading and unloading station 42 has a lower opening that can be closed by a rotor catch 43. The rotor catch 43 may hold an MAS rotor and can be used to manually insert and remove an MAS rotor into and from the loading and unloading station 42 (e.g. for changing the rotor). The loading and unloading station 42 has an access 44 for insert gas. When the rotor catch 43 is removed, the loading and unloading station 42 is automatically rinsed by outflowing eject gas. The rotor lock 41 has a sleeve 45 with a heat insulating effect, which shields the room air in a gas-tight fashion. The stator of the MAS turbine can be (directly and/or indirectly) accessed from the loading and unloading station 42.

The rotor lock 41 may have an additional stator into which an MAS rotor can be inserted and in which the MAS rotor can be rotated by means of a gas flow drive (not shown). The area of the stator of the rotor lock 41 can be cooled (preferably with the same cooling means or gas flow that is used to cool the inside of the tube 2) such that sample material in the inside of a rotor can be cooled while being rotated ("cooling turbine"). This ensures rotationally-symmetric distribution of the solidified sample material in the rotor. A rotor can be supplied by gas pressure from the loading and unloading station 42 into the stator of the cooling turbine and from there, after cooling and standstill of the rotor, be supplied by gas pressure (preferably directly) into the stator of the MAS turbine ("insert"). A measured rotor can be ejected (preferably directly) from the stator of the MAS turbine to the loading and unloading station 42 or into the rotor catch 43 ("Eject"). The rotor lock 41 has a mechanical deflector (not shown in detail) with three positions between the cooling turbine and the vertical transport conduit (cf. section 10a). A first position for the path rotor catch-cooling turbine, a second position for the path cooling turbine-MAS turbine and a third position for the path MAS turbine-rotor catch.

The rotor lock 41 formed as a cryo lock may be integrated in the bottom box 3 of the probe head as shown in FIG. 4, or be flanged to the bottom box 3 (or also directly to the tube 2) (in particular in a removable fashion via a mechanical point of intersection) or also be separate from the probe head and e.g. be located at the bottom below the NMR magnet, wherein in this case a heat-insulating connecting piece should be inserted with respect to the probe head. It is also possible to only provide the loading and unloading station 42 separately from the probe head (e.g. on a laboratory bench) and to connect it via flexible or rigid gas-pressure operated transport conduits to the remaining rotor lock 41 (which is then disposed on or in the probe head) and, in particular, directly to the stator of a cooling turbine. The rotor lock 41 is driven by a supply unit, which provides or drives gas flows (including cooling means flows) and electrical switching processes. The supply unit may be integrated in the bottom box 3. The supply unit is preferably separate from the bottom box 3 and disposed at a sufficiently large separation from the probe head in order to eliminate reciprocal interferences, in particular, with the RF components in the probe head.

The rotor lock 41 and/or the probe head may comprise:
light barriers for determining the position of rotors;
temperature sensors for determining the temperature of rotors, in particular, in the cooling turbine or the MAS turbine;
valves for controlling gas flows, in particular transport gas flows.

Figure 5:
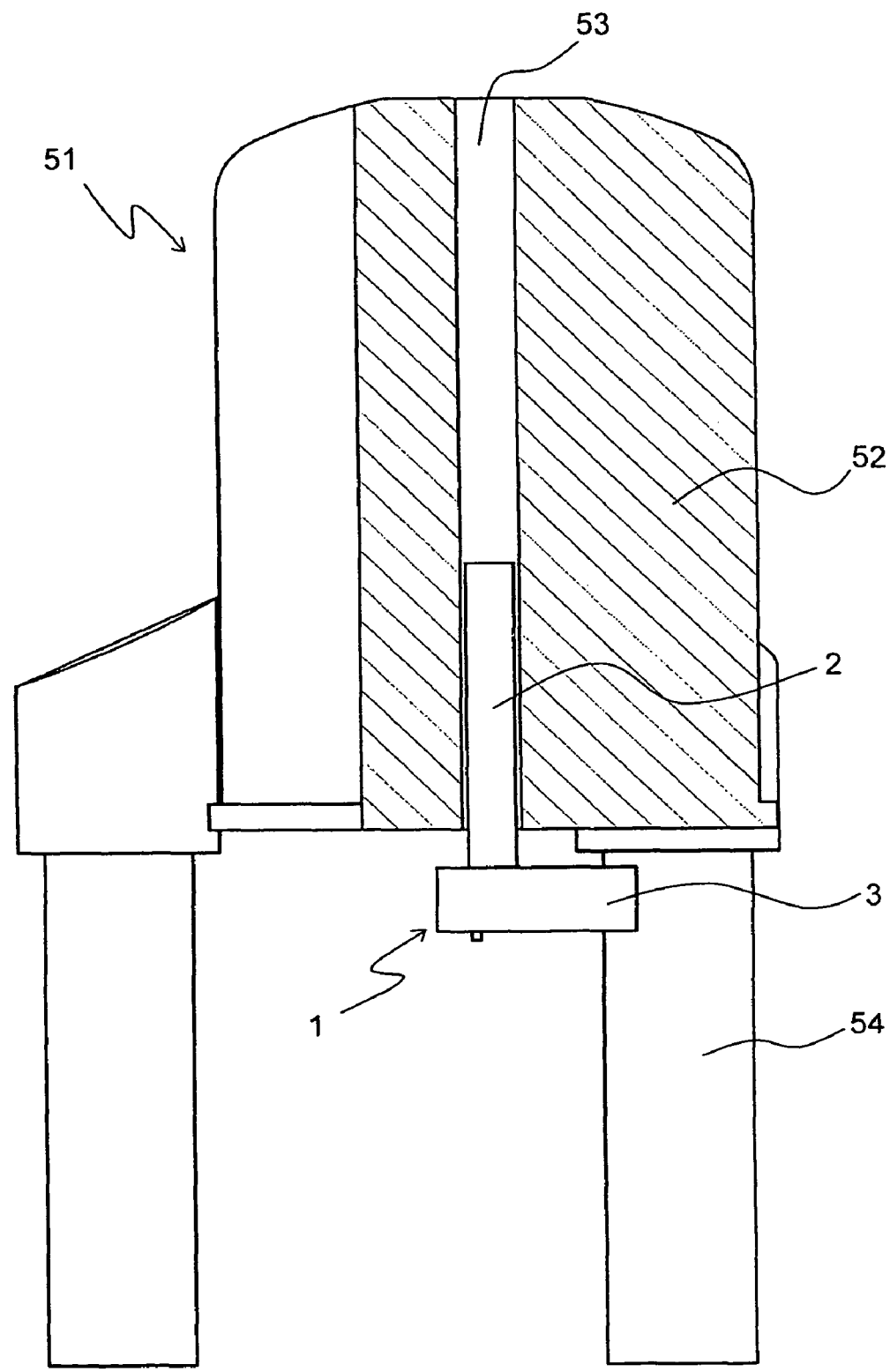
FIG. 5 is a schematic cross-sectional view of an inventive NMR apparatus with an inventive probe head inserted from below into the room temperature bore of the magnet.

FIG. 5 shows an inventive NMR apparatus 51 comprising a superconducting magnet arrangement 52 (in the present case solenoid-shaped superconducting magnet coils which are not shown in detail) with a vertical room temperature bore 53. The magnet arrangement 52 is supported on robust supports 54. An inventive NMR-MAS probe head 1 (cf. FIG. 1) is inserted from below into the room temperature bore 53. The largest part of the tube 2 of the probe head 1 is within the room temperature bore 53, while the bottom box 3 of the probe head 1 is disposed outside of the room temperature bore 53 below the magnet arrangement 52. The'largest (upper) part of the room temperature bore 53 remains free and, in particular, the space above the magnet arrangement 52 does not require any superstructure for a sample changing device. The sample (rotor) can rather be changed through the probe head 1 from below.

Figure 6:
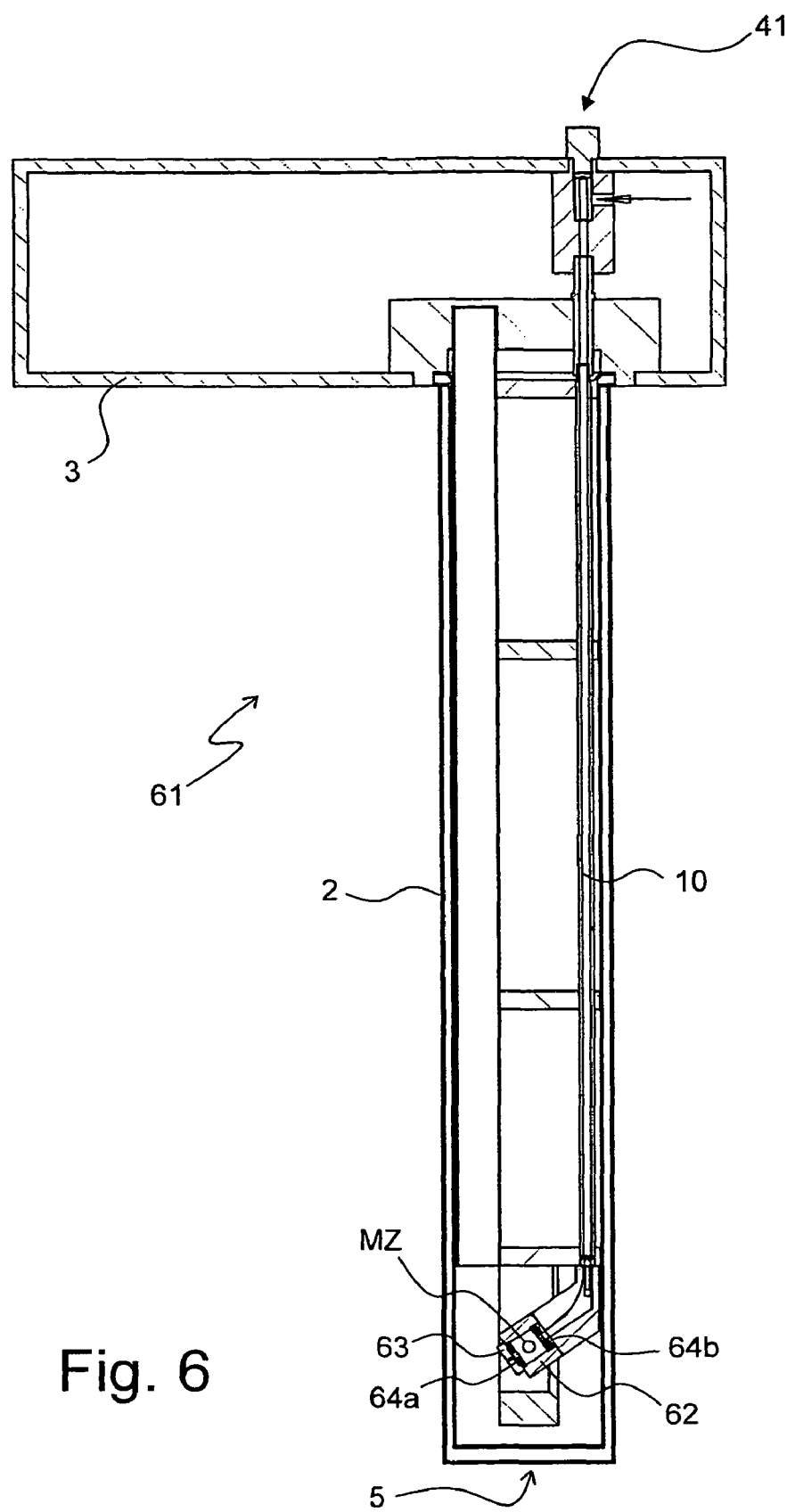
FIG. 6 shows a schematic cross-sectional view of an inventive NMR-MAS probe head without deflector means for insertion from the top into the room temperature bore of a magnet.

FIG. 6 shows another embodiment of an inventive NMR-MAS probe head 61. The probe head 61 is provided for being mounted in suspension in a magnet arrangement, i.e. the tube 2 of the probe head 61 is inserted from the top into a vertical room temperature bore of the magnet arrangement.

A transport conduit 10 extends inside the tube 2, in which an MAS rotor can be pneumatically transported (with gas pressure) from a rotor lock 41 in the area of the bottom box 3 to an MAS stator 62 in the area of the free end 5 of the tube 2, and back. In this MAS stator 62, the bottom bearing 63 and the first radial bearing 64a face away from the bottom box 3, and the second radial bearing 64b, through which an opening for insertion of the rotor extends, faces the bottom box 3. The bottom bearing 63 is thereby disposed below, such that the rotor can be supported on the bottom bearing 63 in response to gravity. During the overall insertion process, the NMR measurement and removal, the orientation of the rotor may substantially be the same, i.e. with the sealing cap facing upwardly. The rotor is introduced with a substantially uniform movement in a downward direction (without turning process), and is also removed with a substantially uniform movement in an upward direction (without turning process).

It must be noted that the magnetic center MZ is typically slightly below the geometrical center of a magnet arrangement, and for this reason, the tube 2 in the embodiment of FIG. 6 must be longer than in the embodiment of FIG. 1, if required.

We claim:

1. A nuclear magnetic resonance (NMR) magic angle spinning (MAS) probe head for measuring a measuring substance in an MAS rotor, the probe head comprising:
a bottom box;
a tube mounted to and projecting from said bottom box;
an MAS stator disposed within said tube in an area of an end of said tube facing away from said bottom box;
an MAS rotor;
a pneumatic sample changing system for supplying and discharging said MAS rotor to and from said MAS stator; and
a transport conduit for pneumatically transferring said MAS rotor within said transport conduit, said transport conduit extending inside said tube from said bottom box to said MAS stator.

2. The probe head of claim 1, wherein said transport conduit contains a deflector means having a blind hole section for intermediate storage of said MAS rotor, wherein, as viewed from said bottom box, said blind hole section is disposed beyond said MAS stator.

3. The probe head of claim 2, wherein said blind hole section is structured to be rotated.

4. The probe head of claim 2, wherein said deflector means contains a branching point of said transport conduit.

5. The probe head of claim 4, wherein at least one nozzle is provided in an area of said branching point for pneumatically deflecting said MAS rotor.

6. The probe head of claim 2, wherein said MAS stator has a bottom bearing facing said bottom box.

7. The probe head of claim 1, wherein said MAS stator has a bottom bearing facing away from said bottom box.

8. The probe head of claim 1, further comprising electric components of the probe head mounted to said transport conduit.

9. The probe head of claim 1, wherein said tube is completely closed in an area of said end facing away from said bottom box.

10. The probe head of claim 9, wherein the probe head is formed as a Dewar vessel in an area of said tube.

11. The probe head of claim 1, wherein said MAS stator is structured to be rotated.

12. An NMR apparatus comprising a superconducting magnet arrangement having a room temperature bore in which the probe head of claim 1 is inserted.

13. The NMR apparatus of claim 12, wherein said room temperature bore is vertically aligned.

14. The NMR apparatus of claim 13, wherein said MAS stator has a bottom bearing facing said bottom box, the probe head being inserted from below into said room temperature bore.

15. The NMR apparatus of claim 13, wherein said MAS stator has a bottom bearing facing away from said bottom box, the probe head being inserted from above into said room temperature bore.

* * * * *